United States Patent [19]
Herrera Van Der Nood et al.

[11] Patent Number: 5,774,467
[45] Date of Patent: Jun. 30, 1998

[54] METHOD AND DEVICE FOR TRANSFORMING A SERIES OF DATA PACKETS BY MEANS OF DATA COMPRESSION

[75] Inventors: José Manuel Herrera Van Der Nood, Rotterdam; Eric Simon Trommel, Zoetermeer; Johannes Bernardus Roubos, Delft; Ben Schellingerhout, Rijswijk, all of Netherlands

[73] Assignee: Koninklijke PTT Nederland NV, Groningen, Netherlands

[21] Appl. No.: 368,986

[22] Filed: Jan. 5, 1995

[30] Foreign Application Priority Data

Jan. 21, 1994 [NL] Netherlands ............................ 9400100
Nov. 25, 1994 [NL] Netherlands ............................ 9401980

[51] Int. Cl.$^6$ ............................................. H04J 3/24
[52] U.S. Cl. ........................................... 370/428; 370/477
[58] Field of Search ..................................... 370/94.1, 94.2, 370/110.1, 84, 118, 7, 9, 389, 392, 395, 412, 428, 429, 474, 477, 470, 471; 395/200, 600, 700; 380/49, 9, 25, 50; 381/34, 35; 348/384; 375/240; 341/61; 455/72

[56] References Cited

U.S. PATENT DOCUMENTS

| | | | |
|---|---|---|---|
| 5,065,397 | 11/1991 | Shiobara | 370/85.5 |
| 5,121,383 | 6/1992 | Golestani | 370/235 |
| 5,307,413 | 4/1994 | Denzer | 380/49 |
| 5,414,812 | 5/1995 | Filip et al. | 395/200 |
| 5,459,722 | 10/1995 | Sherif | 370/60.1 |
| 5,521,940 | 5/1996 | Lane et al. | 370/118 |

FOREIGN PATENT DOCUMENTS

| | | |
|---|---|---|
| 0559593 | 9/1993 | European Pat. Off. . |
| 2687259 | 8/1993 | France . |
| 9316541 | 8/1993 | WIPO . |

OTHER PUBLICATIONS

International Telecommunication Union, CCITT, "Data Communication Over the Telephone Network: Data Compression Procedures for Data Circuit Terminating Equipment (DCE) Using Error Correction Procedures", Recommendation V.42 bis, Geneva 1990, 3 pages.

International Telecommunication Union, ITU–T, "Integrated Services Digital Network (ISDN) Overall Network Aspects and Functions", Recommendation I.363, Mar. 1993 (cover through p. 96).

International Telecommunication Union, ITU–T, "Data Communication Over The Telephone Network", Recommendation V.34, Sep. 1994, (cover page through p. 63).

Mazda F. (Ed.), "Telecommunications Engineer's Reference Book" (copyright 1993, Oxford), pp. 12/3–12/11.

*Primary Examiner*—Dang Ton
*Attorney, Agent, or Firm*—Michaelson & Wallace; Peter L. Michaelson; Michael P. Straub

[57] ABSTRACT

The invention relates to a method and device for converting data packets by coding or compression, source data packets being converted into transmission data packets. In order to achieve an optimal degree of filling of the transmission data packets, a data field of a transmission data packet according to the invention comprises only data of one logical channel. To this end, the compressed data of the logical channels are separately buffered in preferably parallel buffers. Reconstruction information is not incorporated in the data fields of the transmission data packets but, if necessary, is transmitted in advance. The invention is applied, in particular, in X.25 networks.

29 Claims, 6 Drawing Sheets

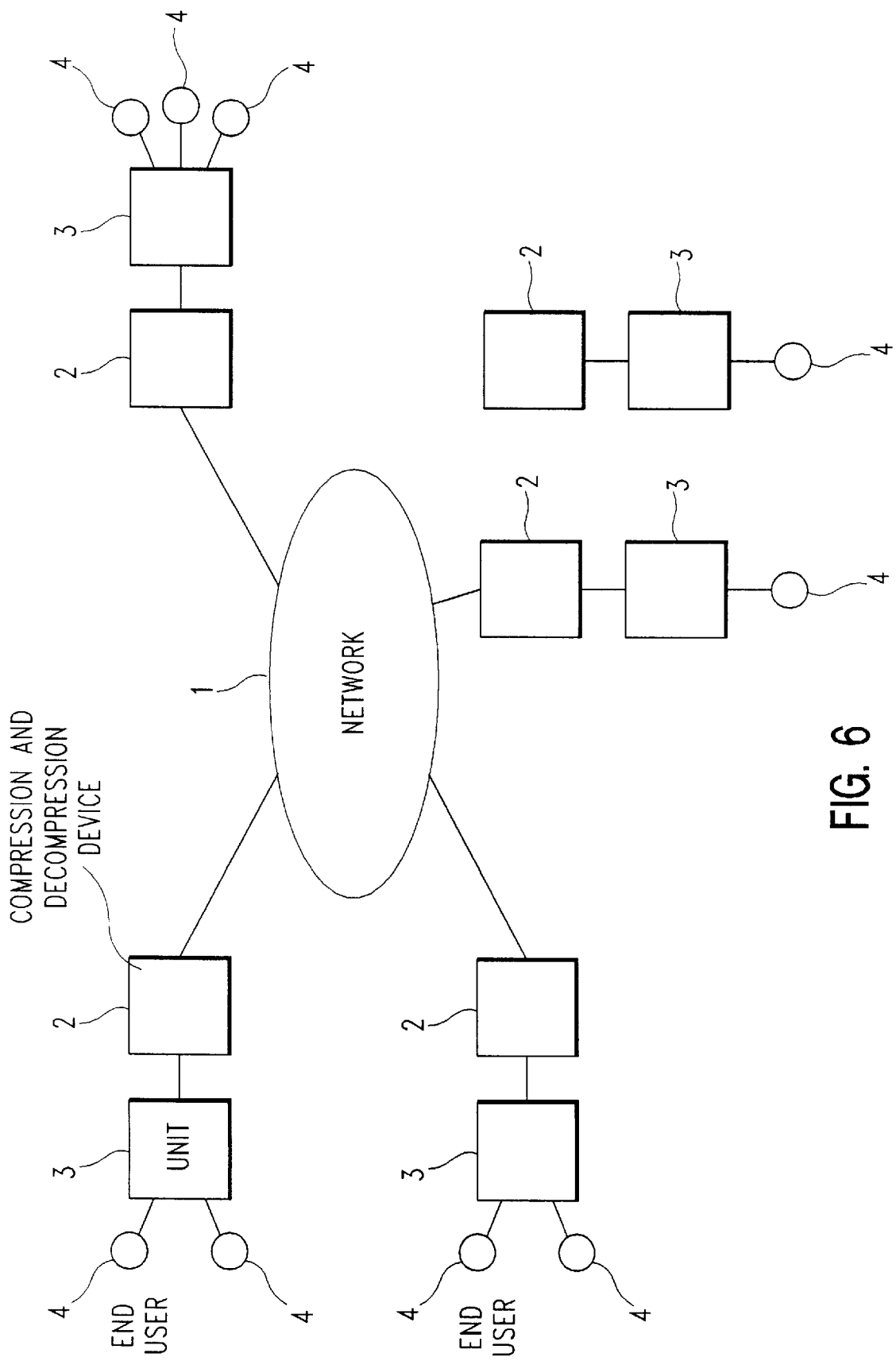

METHOD AND DEVICE FOR TRANSFORMING A SERIES OF DATA PACKETS BY MEANS OF DATA COMPRESSION

BACKGROUND OF THE INVENTION

The invention relates to a method for compressing data packets, a method for decompressing data packets, devices for compressing and decompressing data packets, and a system for transmitting data packets in compressed form. In more general terms, the invention relates to a method for performing, in a communication system, a length conversion of so-called primitives, and to means for implementing said method.

More in particular, the invention relates to a method for converting a first series of data packets, each having a header field and a data field, into a second series of data packets, each having a header field and a data field, both series comprising data packets of a plurality of channels, and data from the data fields of the first series being subjected to a compression process and then being accommodated in the data fields of the second series. Such a method is known from European Patent Application EP-A-0,559,593.

Data compression is applied in practice in order to increase the capacity of a communication channel. By means of compressing the data to be transmitted, a certain amount of data can be transmitted in less time or with a smaller bandwidth. The data compression in this context is effected in many cases by a compression process in which the frequency of occurrence of data words or messages is used to code the data more efficiently: by replacing the most frequent data by a short code and less frequent data by a longer one, a high degree of compression can be achieved. The compressed data can then be transmitted, for example in the form of data packets. Thus a first series of data packets is transformed into a second series; in the case of a successful compression the second series will generally be shorter, i.e. contain less data than the first series.

In the known method, a first series of data packets which may originate from various sources (channels), is transformed into a second series of data packets which can be transmitted via one (network) channel, information being stored, in the data fields of the second series, relating to the original data packets. Thus the data fields of the second series contain subheader fields wherein, inter alia, the length of a compressed data field and reconstruction information is stored. On the basis of said subheader fields, the original data fields, i.e. the data fields of the data packets of the first series, can be reconstructed.

This known method has the drawback that a relatively large amount of supplementary information, i.e. the subheader fields, has to be transmitted. As a result, the data fields of the second series are effectively reduced in size and the useful transmission capacity of the data packets decreases. This effect is even stronger for smaller packet lengths, where a relatively large portion of the potential transmission capacity is taken up by this overhead. Moreover, in the case of the known method, the subheader fields must always be separated at the receiving side from the useful data, before the data fields can be decompressed. This entails an additional processing step which costs both processing time and processing means (circuits and/or software). If the known method is used for transmitting, via a network having intermediate stations (exchanges, switching points), messages between various sources and destinations, the known method further entails the need for all intermediate stations to support the compression function, since the routing of the network has to be adapted to the bundling of channels in compressed data packets.

SUMMARY OF THE INVENTION

The object of the invention is to overcome the above-mentioned and other drawbacks of the prior art and to provide a method for transforming, by means of data compression, a series of data packets which provides for efficient transmission of the compressed data by making optimal use of the data fields of the second series.

In particular, it is an object of the invention to provide a method for transforming data fields, which provides for data packets of different channels to be processed efficiently.

It is a further object of the invention to provide a method for transforming data packets, which is particularly suitable for use in X.25 networks.

It is also an object of the invention to provide a method for transforming data packets, which is independent of the compression or decompression process used.

To this end, the method according to the invention is characterized in that each data field of the second series contains data of only one channel, and in that data to be accommodated in a data field of the second series are buffered per channel. In other words, in the second series only data of one channel are incorporated in the data field of each data packet. This has the advantage, inter alia, that the (compressed) data of the various channels are transmitted in separate data packets, so that it is not necessary to specify, within a data packet, which data belong to which channel. The data packets of the second series can thus, in principle, be passed directly to their final destinations without first being decompressed. By compressing each channel separately, according to the invention, it is further ensured that only the transmitting and the receiving station within a network need support compression, without the transmission network itself being designed for compression. According to the prior art mentioned, in contrast, an adaptation of the network is necessary to support compression of a plurality of channels, i.e. of a plurality of (source) channels to one (network) channel.

In order to provide for the possibility of successive data packets, in the first series (of original data packets), belonging to different channels, without transmitting, in the second series, partially empty data packets, according to the invention the data of the different channels are buffered separately, i.e. per channel. This makes it possible to optimally fill the data packets of the second series (of "compressed" data packets) with data, since for each channel compressed data can be saved up, for example until the data field of a data packet is entirely filled.

In this context, incidentally, the term "channel" refers to a logical channel, in other words a transmission route between a source (sending side) and a destination (receiving side), which route exists for a certain time. In the process, a plurality of channels can be active over one physical link, but a channel need not expressly be allocated to a specific physical link. Via a channel, one or more messages are transmitted in the form of data packets, a message generally being concluded by a marker "end of message" (stop code). Such a marker "end of message" therefore indicates the end of a group of data packets which are functionally associated with each other.

A channel may incidentally comprise several subchannels (constituent channels), where e.g. one subchannel carries user data while another carries control data. In the case of X.25, for example, the subchannels are identified by the Q-bit. In case subchannels can be identified, the method according to the invention is characterized in that each data field of the second series contains data of only one subchannel, and in that data to be accommodated in a data field of the second series are buffered per subchannel. It will be understood that a subchannel may coincide with a channel. For this reason, in this text the word "channel" will generally be understood to mean "channel or subchannel".

The abovementioned series of data packets can, as already mentioned, contain data packets of a plurality of channels, but may also be composed of data packets of only one channel (or subchannel). At the same time, the series may comprise one or more messages, can be both synchronous and asynchronous and need not have a fixed or specific length. Thus a "series" may even consist of a single data packet.

When stated in terms of the OSI model (cf. reference 3, chapter 12), the invention can be said to provide a method for performing, in a communication system, a length conversion of primitives of a first layer (e.g. n), the primitives being transferred on a second, lower layer (e.g. n–1), the primitives having functional relationships, and the length conversion comprising adapting the number of data units in such a way that the primitives maintain their functional relationships. In the above-mentioned cases, the functional relationships comprise a channel or user identity, while the length conversion comprises data compression.

In the method according to the invention, preferably, a check is carried out as to whether the last data packet of a channel occurs in the first series, and in the event of the occurrence of the last data packet all the buffered data of that channel are accommodated in one or more data packets of the second series. I.e., as the last data packet of a channel is received, the respective buffer (or set of buffers) is flushed, all data of that buffer being passed on to data packets. Thus the group of data packets of a certain channel is terminated without a specific waiting time having to have elapsed for this purpose. Further, the flushed buffers can be made available to a different channel. Incidentally, in this context the term "the last data packet of a channel" may generally be understood as "the last data packet of a group of data packets of a channel", therefore including the last data packet of a message transmitted via that channel. The channel itself, which may comprise, for example, a physical or logical link, may continue to exist in the process. The occurrence of the last data packet can be detected, in so doing, on the basis of, for example, a marker "end of message". The said group of data packets, of which the occurrence of the last data packet is detected, may also comprise a part of a message or a plurality of messages, for example the data packets of a channel, which have been received during a certain period.

When the last data packet of a channel of the first series has occurred and the buffered data are accommodated in a data packet of the second series, it is possible that the buffered data may not fill the data field of the data packet in its entirety. So as to be able to determine in a simple manner on the receiving side where the useful data end, it is provided that, if in the second series the data field of the last data packet of a channel is not filled in its entirety, that data field be supplemented with trailer data. These trailer data are preferably chosen in such a way that they can be recognized as such on the receiving side in a simple manner and therefore preferably comprise a fixed code. Thus the trailer data can comprise a string of identical bits, preferably at least eleven ones. The number of identical bits is advantageously selected in the process in accordance with the coding used for the data compression, for example in such a way that the number of bits is equal to, or greater than, the number of bits of the longest code word.

Preferably, if trailer data are present in a data packet of the second series, a check is carried out as to whether a last data packet has occurred in the first series. Thus a simple, yet highly effective error check is provided.

Advantageously, the method according to the invention is carried out in such a way that a data field of the second series exclusively comprises compressed data and/or trailer data. In other words, in a data field of the second series no supplementary information occurs with respect to the length of a message, the channel in question and the like. Thus the available transmission capacity of the data packets can be utilized optimally. Incidentally, in this context, the so-called "compressed data" may in some cases also contain non-compressed data which do, however, originate from a data field of the first series.

Preferably, the occurrence of the last data packet of a channel is diagnosed on the basis of information in the header fields of the data packets of the first series. Thus the identification of the last packet may take place, for example, at the same time as the channel identification. If data packets are to be converted, however, which are not provided with such an identification in the header fields, the occurrence of the last data packet can be diagnosed in a different manner, for example by identifying trailer information in a data field of the first series.

If the data packets are designed for data transmission in accordance with the X.25 protocol, the information on the basis of which the occurrence of the last data packet of a channel is diagnosed advantageously comprises the m bit ("more bit"). If the m bit is equal to zero, no further data packets of the same channel will follow. Thus a very simple identification of the last data packet is possible.

In the method according to the invention, many different compression processes can be used. Advantageously, there is applied, in the compression process, a table containing code words, which is based on the frequency of the occurrence of data. With reference to such a table, each original data word is replaced by a code word, certain data words which occur frequently (or, for example, have a high information content) being allocated a relatively short code. With compression processes of this type, known per se, the table can be compiled during the compression process. With the method according to the invention, however, a fixed (frequency) table is advantageously used. By means of a (predetermined) fixed or at least temporarily fixed table it is possible to prevent data expansion taking place at the beginning of the compression process. Moreover, this prevents bit errors in the transmission from resulting in the respective tables of the transmission side and the receiving side getting out of synchronization. After a predetermined time or after a predetermined amount of data packets, the table can be renewed and/or checked.

Although the method according to the invention is highly suitable for use in the case of many channels, it is also possible to carry out the method if all the data packets of the first series belong to the same channel. In case the first series comprises data packets of a plurality of channels, it is possible for compression to be applied only to data packets of some of the channels, so that the data of at least some channels are accommodated in the second series in non-compressed form. In the process, the non-compressed data may not have changed at all or may have been subjected to an entirely different operation such as encipherment.

Further, data which indeed were compressed may also be subjected to a different operation such as encipherment.

Although the method according to the invention is here described with reference to the conversion of data packets, it is also possible to convert, instead of the first and/or third series of data packets, one or more (synchronous or asynchronous) bit streams. It is also possible for the first series and, in the case of bidirectional traffic, the third series too, to be formed by a series of time slots.

The invention further provides a method for transforming a second series of data packets into a third series of data packets having header fields and data fields, data from data fields of the second series being subjected to a decompression process and being accommodated in data fields of the third series. In so doing, data which are to be accommodated in a data field of the third series are preferably buffered per channel. If the decompression and the compression are symmetrical, data packets of the third series can in this case be identical to data packets of the first series.

When the method according to the invention is applied to the transmission of data packets, wherein in the first series data packets of at least one channel occur intermittently it is possible, advantageously, to transmit intermittently, for that channel, at least one data packet of the second series, even if the data field of that data packet is only partially filled. As a result, long delays in the data transmission can be prevented. (If, in the process, the data packets of the first series are transmitted in accordance with the X.25 protocol, it may be advantageous to ignore the m bit of such a data packet). Data packets of the second series may to this end be transmitted, for example, at predetermined times or if a specific time has elapsed since (generally compressed) data have been placed into an empty buffer (so-called "time-out mechanism"). In such a way, data packets can be compressed and transmitted intermittently. This is especially advantageous for data sources which generate data only intermittently, such as measuring instruments. If the data packets of the second series are smaller than those of the first series, the data compression will always result in an improvement of the efficiency of the data transmission, even if each data packet of a first series is converted into one data packet of the second series (1-to-1 conversion). In the case of X.25, data packets of the second series may then consist of fewer segments (of e.g. 64 bytes).

The invention moreover provides a device for compressing data packets, a device for decompressing data packets, and a system for transmitting data packets in compressed form.

REFERENCES

[1] EP-A-0,559,593
[2] ITU Recommendation V.42 bis
[3] F. Mazda (Ed.): "Telecommunications Engineer's Reference Book", Oxford 1993
[4] ITU Recommendation V.34
[5] ITU B-ISDN Adaptation Layer Specification I.363
[6] P. Horowitz & W. Hill: "The Art of Electronics", Cambridge 1989.

BRIEF DESCRIPTION OF THE DRAWINGS

The invention will be explained below in more detail with reference to the figures.

FIG. 6 schematically shows a system for transmitting data packets, in which the invention is applied.

DETAILED DESCRIPTION OF THE DRAWINGS

Figure 1:
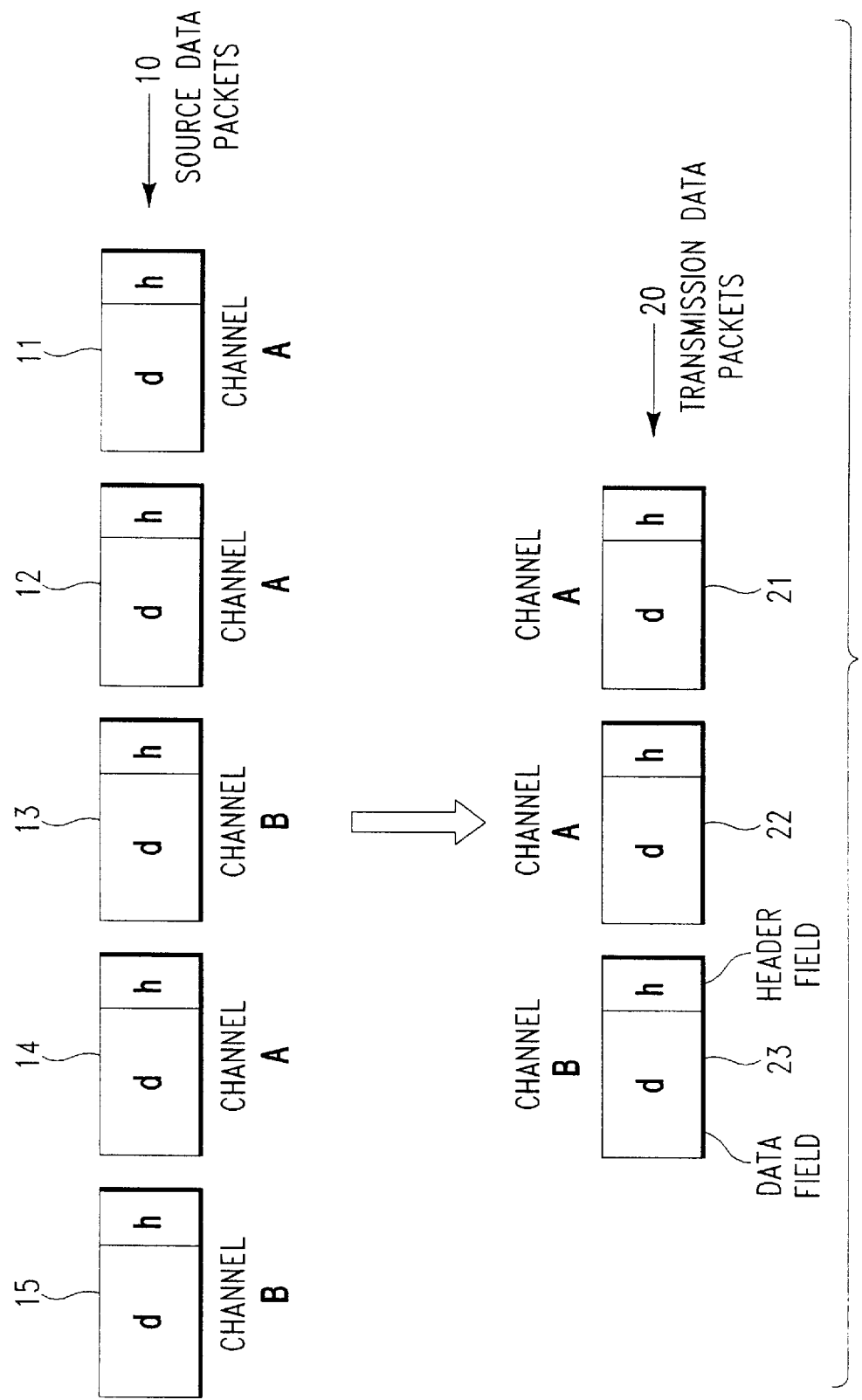
FIG. 1 schematically shows converting a first series of data packets into a second series of data packets.

FIG. 1 depicts a first series 10 of (source) data packets by way of example. The successive data packets 11, 12, 13, 14 and 15 of the series 10 may belong to different channels. In the case depicted, the data packets 11, 12 and 14 belong to a channel A, while the data packets 13 and 15 belong to a channel B. Obviously it is possible, in practice, for longer series to occur, whose data packets belong to more than two channels.

The invention makes provision for converting the first series 10 into a second series 20 of (transmission) data packets. The successive data packets 21, 22 and 23 belong, respectively, to the channels A, A and B.

Each data packet of the series 10 and 20 depicted comprises a header field (or header) h and a data field d. By means of a suitable compression process being employed, the data packets 11 to 15 (inclusive) are converted into the data packets 21 to 23 (inclusive). According to the invention this involves accommodating, in the data fields d of the (transmission) data packets of the series 20, only the data fields d of the (source) data packets of the series 10 in compressed form. In other words, the information of the header fields h of the data packets 11 to 15 is not incorporated into the data fields of the data packets 21 to 23. On the other hand, the header fields h of data packets of a first series 10 may correspond, at least in part and in some cases even entirely, to the header fields h of data packets of a second series 20. It is also possible, however, for the second series to have a structure entirely different from that of the first and, for example, to be composed according to a different protocol.

A series of data packets of the same channel, as can be formed, in the first series 10 depicted, by the data packets 11, 12 and 14, will in general have a limited length. The last packet of such a group is generally provided with a marker in order to tell the destination that a particular message is completed. In the case of X.25 this is indicated by incorporating in the header field a bit ("more bit" or "m bit") which is equal to zero (m=0) if no further data packets of the same message or channel follow; otherwise the bit is equal to one (m=1). Another way of indicating that no further data packets of the same group follow, is to incorporate in the data field a stop code ("end of message") which can be recognized by the recipient. Such a stop code may, for example, consist of control symbols which can be distinguished in a simple manner from the ordinary, useful data. If desired, the end of a message can be derived from the timespan elapsed since the last data packet of that channel was received ("time-out").

According to the invention, the data packets of the series 20 each contain (compressed or non-compressed) data of only one channel (or subchannel), and the data for each channel are buffered separately. By allocating each data packet of the second series 20 to only one channel, it is possible to achieve a simple way of decompressing at the receiving side (destination), the data fields d of the data packets of the second series 20 not first having to be separated into fragments of separate channels. Moreover, it is thus not necessary to incorporate in the data fields d supplementary information with respect to the parts of the data field which belong to a particular channel, such as length information of blocks within the data field. Thus more efficient transmission is achieved, since the data field of a data packet of the second series can be filled solely with data. Incidentally it is possible also to accommodate non-compressed data in a data packet of the second series, for example if one or more channels (or subchannels) are not compressed. This may e.g. be the case if a particular subchannel contains control data.

By buffering data of each channel substantially separately it is possible to achieve an optimal degree of filling of the data fields d of the second series 20. If such buffering were not to take place, compression would admittedly result in a smaller amount of data per data packet, but the number of data packets per channel would in principle remain the same, and as a result in most cases no advantage would be gained (unless the data packets of the second series have a shorter length than those of the first series, which imposes a restriction on the second series, though). By means of the abovementioned combination of measures, a very large degree of efficiency of the data transmission can be achieved, without making any demands concerning the structure of the data packets of the second series. At the same time, a large degree of flexibility in routing is provided, since intermediate stations of the network, via which the compressed data packets are transmitted, do not require any adjustments for the purpose of the compression to be made therein.

It should be noted that, where this text speaks of a "data packet", this can also be understood as protocol data unit ("PDU"), container or data unit in general. It will be evident that the data packets or data units may also comprise, apart from a header field and a data field, other fields such as a trailer field (or trailer). However, this is not essential for the invention. The invention can even be applied to data streams which are not presented in packet form. In particular, the invention can be applied advantageously in the compression and decompression of data packets in networks operating in accordance with the X.25 protocol, especially for application on layer 3 of the OSI model.

Figure 2:
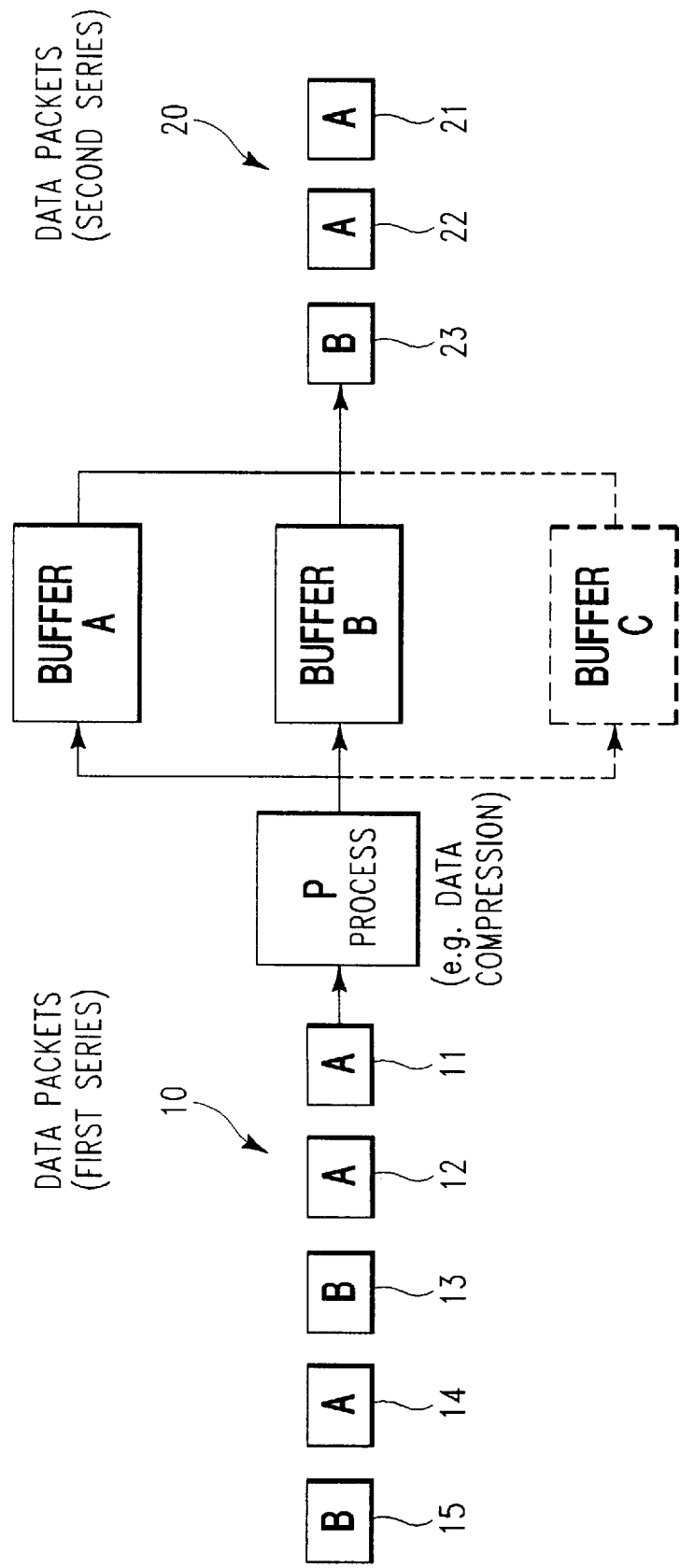
FIG. 2 schematically shows the process of compressing, according to the invention, a series of data packets.

In FIG. 2 the method according to the invention is schematically depicted. The first series 10 of data packets, shown in more detail in FIG. 1, is converted into the second series 20 of data packets. In the process, the data packets 11–15 of the first series 10 are first subjected to a process P which may comprise a suitable data compression process known per se, such as a data compression process which operates according to the Ziv-Lempel procedure which is well known in the art. In the case shown, the process P also comprises a channel identification. The compressed data are buffered, specifically separately for each channel. The compressed data of the data packets 11, 12 and 14 are therefore continually buffered until a data field of the second series can be filled in its entirety. In the case shown, the compressed data of the data packets 11 and 12 would be able, for example, to fill the data packet 21 in its entirety, after which this data packet can be transmitted. Any remaining compressed data of channel A are stored in the buffer of channel A ("Buffer A"). Then the data of the packet 13 are compressed and stored in the buffer of channel B ("Buffer B") (assuming that these data do not fill in its entirety a data packet of the second series). The next packet to be compressed, data packet 14, is the last packet of the group consisting of the packets 11, 12 and 14. After compression, the compressed data of channel A are stored temporarily in the buffer of channel A, after which the buffer is flushed and the compressed data of channel A are stored in the packet 22. If the packet 22 is not thereby filled in its entirety, trailer information can be appended. It is preferably specified in the header of the data packet 22 that this is the last packet of a group. The packet 15 may in the meantime have already been subjected to the compression process. As was the case for channel A, the compressed data will be stored for a short time in the buffer in question, in this case the buffer of channel B, in order then to be accommodated, together with the data already present in that buffer, in the data packet 23. It is preferably specified in the header of the data packet 23 that this is the last data packet of a group (or channel, respectively). If required, the data field of the data packet 23, as was the case for the data packet 22, is provided with trailer information (trailer data).

It will be understood that the buffering actions of the buffers mentioned here can be implemented in many ways, and that, for more than two channels, a plurality of buffers may have been provided, as is shown in the figure by means of broken lines (optional Buffer C for channel C). If the last data packet of a particular channel has been transmitted, the buffer of that channel may, if required, be allocated to another channel. Thus, if channel B, for example, is terminated, Buffer B can be allocated to a new channel, for example channel C or D.

As indicated in the above, the time which data spend in a buffer can in many cases be very short. The function of the buffers is mainly that of collecting data of a particular channel, in such a way that the packets of the second series can be utilized as efficiently as possible.

Decompressing according to the invention comprises receiving (transmission) data packets, subjecting the data fields of these transmission data packets to a decompression process, and forming (destination) data packets containing, in their data fields, the decompressed data. Since no reconstruction information need be extracted from the data fields, the decompression and the forming of destination data packets can take place directly. Advantageously, decompressing can take place in a manner entirely analogous to that of the compression process sketched in FIG. 2.

Figure 3:
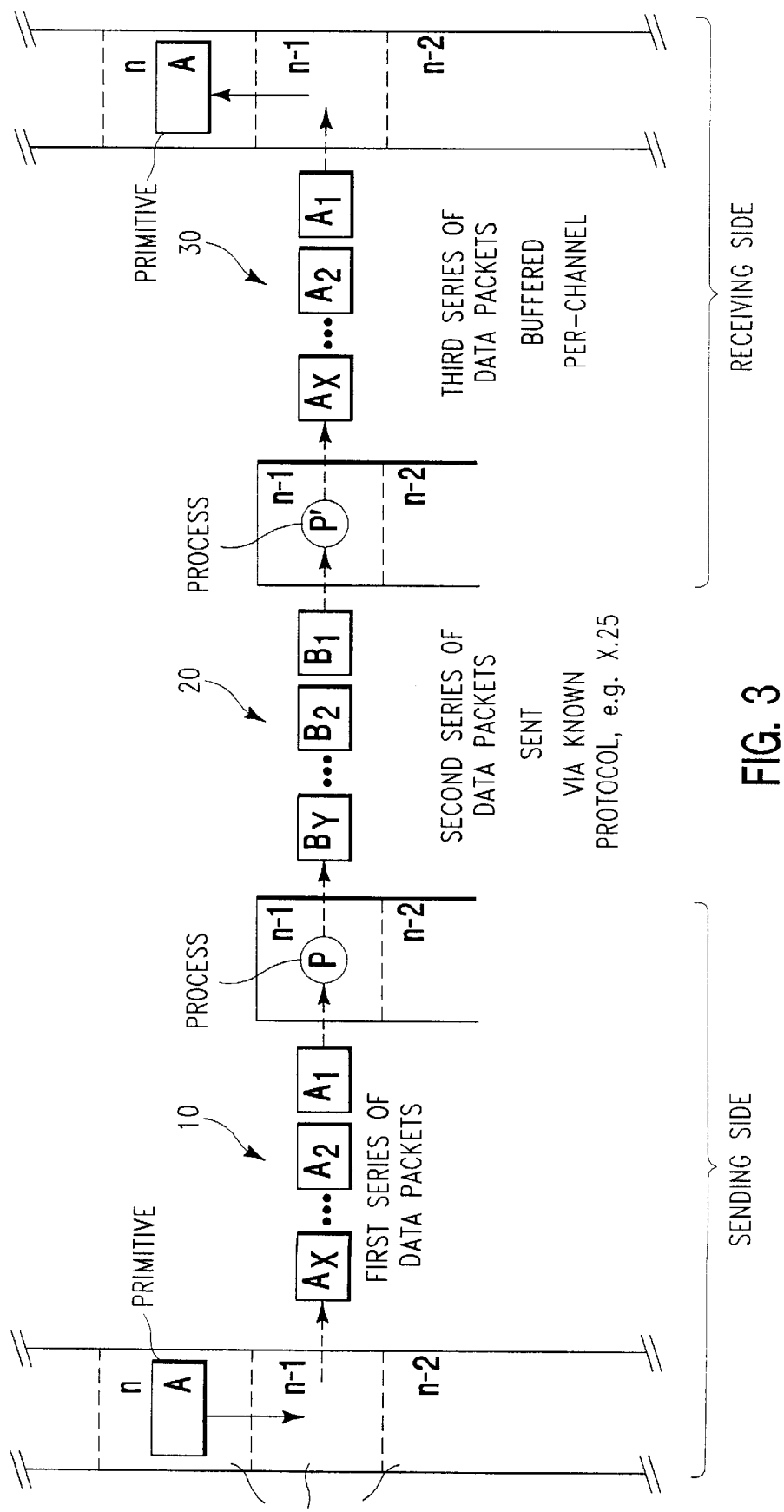
FIG. 3 schematically shows the method of the invention in relation to the OSI model.

In FIG. 3, the method of the invention is schematically shown in relation to the OSI model (cf. reference 3, chapter 12). When communicating according to the OSI model between two layers (n, n−1) of a communication network, between those layers a transfer takes place of so-called primitives, also referred to as Interface Data Units (IDUs). The primitives of layer n are dealt with in layer n−1, that is in a lower layer. The primitive of layer n will be transformed by layer n−1 into one or more Protocol Data Units (PDUs), which constitute the "virtual" communication between layer n−1 of the sending side and layer n−1 of the receiving side. For example, for layer 3 of X.25 these are the packets of the so-called Packet Level Protocol.

In most cases the data packets $A_1, A_2, \ldots, A_x$ will be transferred via the intermediate network to layer n−1 of the receiving side. If, however, on layer n−1 a processing of the data takes place, such as data compression or decompression, the structure of the data units (i.e. data packets or PDUs) necessary to transfer the primitives should not be affected by this processing. It should be noted that the length of the data in a primitive can be substantially greater than the maximum length of a data unit, the length of a data unit often being dictated by the network concerned.

In FIG. 3, a primitive A is shown to be passed on from layer n to layer n−1 at the sending side, indicated by S. The primitive A represents a series of data packets or data originating from higher layers at the sending side. At layer n−1, the primitive A results in a first series of data packets $A_1, A_2, \ldots, A_x$, this series corresponding to the series 10 in FIG. 1 and 2. The series is subjected to a process P, such as a data compression process or, in general, coding process. As is shown in FIG. 3, this process takes place at layer n−1. As a result of the process P, a second series of data packets $B_1, B_2, \ldots, B_y$ is produced, this second series corresponding to the series 20 in FIG. 1 and 2. In the cause of data compression, the number of data packets of the second series will be smaller than that of the first series; y<x. The second 20 is transferred via a network (not shown for the sake of clarity). As depicted, the transfer of the series 20 via a network takes place at layer n−1, but may involve other (lower) layers, such as layer n−2.

At the receiving side, denoted by R, the previous steps are substantially reversed. First, the series of data packets $B_1, B_2, \ldots, B_y$ is subjected to the process P', this process P' being in most cases the inverse process of the process P the sending side, e.g. data decompression where the process P involved data compression. As a result of this, a third series 30 is produced, this third series 30 in most instances being equivalent to the series 10 and comprising data packets $A_1, A_2, \ldots, A_x$. These data packets of layer n−1 are subsequently passed on as a primitive, again denoted by A, to the next higher layer (n) of the receiving side R. The primitive A may be passed on to still higher layer as necessary.

As the example of FIG. 3 shown, data packets of a first format $(A_1, A_2, \ldots, A_x)$, are processed (P), transferred as data packets of a second format $(B_1, B_2, \ldots, B_y)$ and processed again (P') at layer n−1. In this example, the original and resulting data packets are identical, as are the corresponding primitives. The method according to the invention therefore provides a length conversion of primitives of a certain layer (n) at a lower layer (n−1). As was explained under reference to FIG. 2, in this method the functional relationships of the primitives are retained by assigning the data packets of the second series $(B_1, B_2, \ldots, B_y)$ to one channel or subchannel only. Said functional relationships may comprise e.g. the (sub)channel identity and/or user identity of the primitives. As mentioned above, a subchannel is a constituent part of a channel, e.g. all X.25 data packets of a cervix channel having a Q-bit which equals 1 constitute a subchannel of said channel.

At layer n−1 the structure of primitives is indicated by a marker "end of message". In the case of X.25 such a marker is constituted by an m bit equalling zero. In ISDN based networks, for example, this principle an also be applied. In the case of ISDN the routing layer can be constituted by an arbitrary routing protocol, e.g. layer 3 of X.25. In the case of ATM the marker "end of messages" is constituted by the so-called Segment Type Field or "ST Field" (cf. reference 5). This indicates the relationship between data units (so-called SAR PDUs) and primitives (so-called SAR SDU's). Ignoring the "end of message" in order to obtain a higher compression factor is supported in ATM in the ST Field by the so-called Single Segment Message (SSM).

Preferably, the layer n−1 mentioned in the example of FIG. 3 is layer three of the-OSI model (n equalling 4). However, layer n−1 may also refer to other levels of the OSI model, such is layer 2 or 4. The method of the invention may be applied to all communication techniques band on the OSI model. Preferably, the processing take place in or above the routing layer in order to maintain independence from the routing.

The method of the invention, when applied at layer 3 of the OSI model, has the additional advantage that data compression can take place at the same layer as tariffing. When compressing at layer 2, the user payload is not decreased by data compression. A further advantage of applying the invention at layer 3 in the high compression factor made possible, as at layer 2 a combination of information sources takes place, causing a low redundancy of the data. Because of the said combining, an adaptive compression algorithm will not be able to obtain an optimal compression as the data to be compressed have varying characteristics. With the invention, however, a high compression ratio can indeed be obtained, since compression takes place at a higher layer of the OSI model and the data of the various sources can be processed separately.

Figure 4:
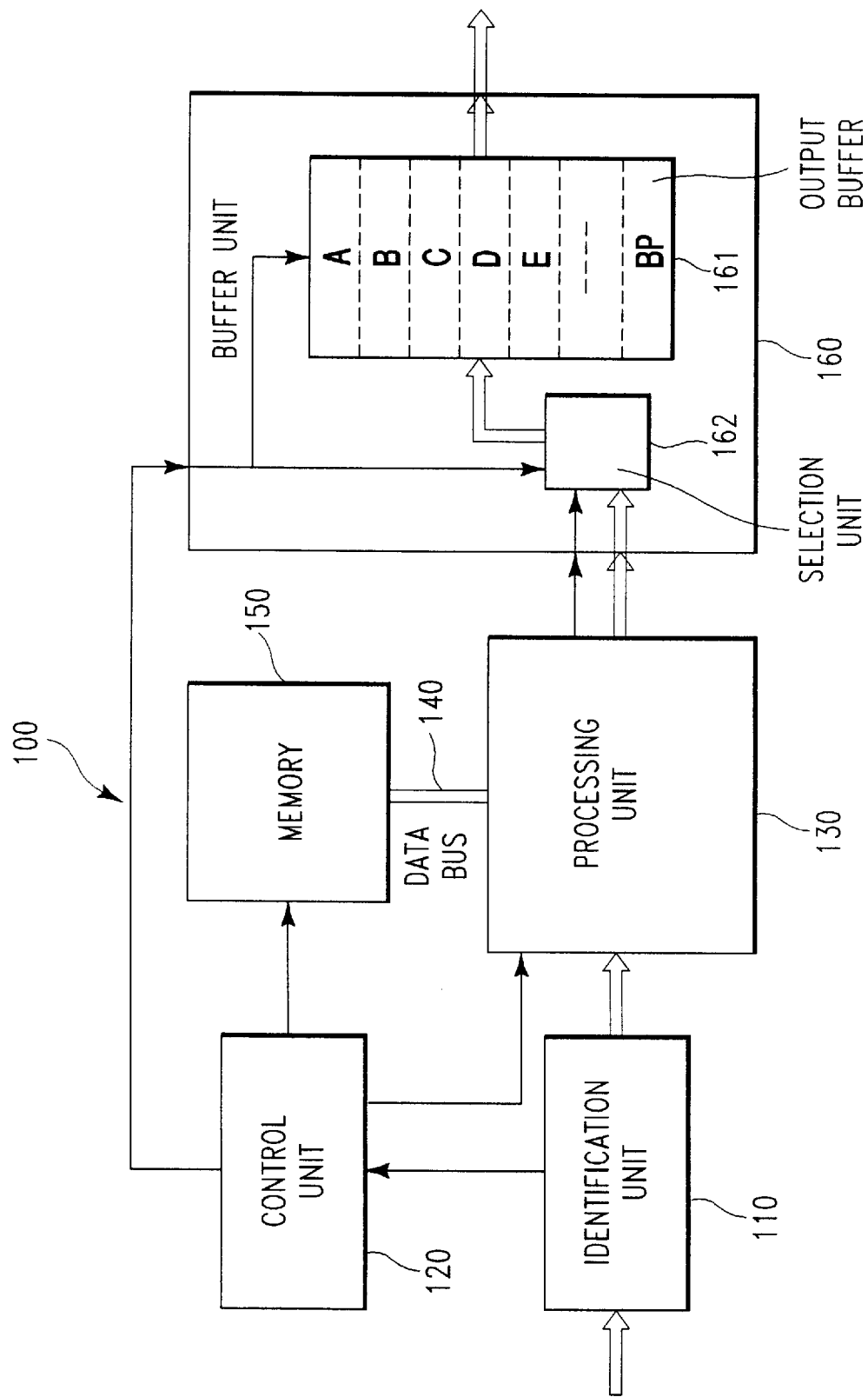
FIG. 4 schematically shows a first embodiment of a device for compressing and/or decompressing data packets according to the invention.

The device 100 depicted schematically in FIG. 4 comprises an identification unit 110, a control unit 120, a processing unit 130 which is linked, via a data bus 140, to a memory 150, and a buffer unit 160. The identification unit 110 comprises an input buffer and, coupled thereto, identification means for identifying (the channel of) incoming data packets. The identification is passed to the control unit 120 which thereupon can address the processing unit 130 and the memory 150 in a channel-related manner. Thus the memory 150 may have stored therein different compression processes which can be used for different channels. Decompression processes can likewise be stored in the memory 150, so that the device 100 can also be used for decompression; if required, the device 100 is able to compress for some channels and decompress for other channels. In so doing, a decompression process, or reconstruction data required for that process, can be transmitted when a channel is set up, prior to the data packets to be decompressed. It is also possible for the memory 150 to be constructed, in its entirety or in part, as read-only memory (ROM), so that certain data (reconstruction data for the benefit of decompression processes as well as one or more decompression processes themselves) are permanently present in the device 100. Even if the device 100 is used as a compression device it may be advantageous to accommodate certain data in a read-only memory.

The process required for a particular channel is loaded, under the control of the control unit 120, via the data bus 140 from the memory 150 into the processing unit 130. The processing unit 130 preferably comprises a microprocessor for executing the processing process. Advantageously, the processing unit 130 is fitted with a processor memory for storing data relating to the current process. The task of the processor memory may, however, also be performed by the memory 150. In order to increase the processing speed of the device 100, there may be connected to the data bus 140 a plurality of parallel processing units 130. Alternatively, a plurality of (micro)processors, each with a processor memory if required, can be accommodated in a processing unit 130.

The buffer unit 160 comprises an output buffer 161 which, according to the invention, is composed of a plurality of buffer sections A, B, C, etc., for the benefit of the corresponding channels. As already stated above, the allocation of buffers to specific channels need not be fixed and may if required be altered, depending on circumstances. Thus the buffer section A in FIG. 4, after channel A has terminated, can be allocated, for example, to a (new) channel H.

Each buffer section A, B, etc. of the output buffer 161 preferably comprises a (shift) register but may also be formed by random-access memory (RAM). A supplementary buffer section BP ("bit pointer") is provided for storing information which specifies what amount of data, in particular how many bits and/or bytes, is stored in each of the other buffer parts or, respectively, remained after the last data packet to be transmitted was filled. If required, the buffer section BP may be formed by separate, reserved portions of the buffer sections A, B, etc.

The buffer unit 160 further comprises a selection unit 162, formed by, for example, a multiplexer, for selecting a buffer section in which data entering the buffer unit 160 must be stored. This selection takes place, in the example shown, on the basis of control signals which have been generated by the control unit 120 on the basis of identification information. The buffer unit 160 may also comprise means (not shown) for generating suitable data packets having, for example, a length of 128 bits, in which data are transmitted from the buffer sections.

With the aid of the device 100 according to the invention, rapid and efficient compression of a series of data packets is possible, therefore. The degree of efficiency may in this context additionally depend on the occurrence of stop codes or other markers (such as the m bit) which indicate the end of a group of data packets (message, channel). Preferably, the device 100 is designed in such a way that the discounting of stop codes and the like is adjustable. This makes it possible to adapt the mode of operation of the device to the equipment connected to the device.

In a first mode, the device takes no account at all of the end of a group of data packets, so that data are buffered for each channel even if a message is complete. This entails the highest degree of filling of data packets of the second series, since it is now not necessary to transmit, at the end of each group, a data packet which (in most cases) is partially empty or is provided with trailer data. In order to ensure that the last data stored in the buffer in question are sent, a timing mechanism may be provided which involves, for example, the control unit 120 flushing the buffer of a particular channel and causing a data packet to be emitted from that channel if, during a certain time, no data packet of that channel has been received in the device 100. Said flushing of a buffer may also take place at fixed times, or if the destination sends a request to this effect to the device 100. Such a request may take the form of a special code in the data of a data packet transmitted to the device 100.

In a second mode, likewise no account is taken of the end of a group of data packets, but a packet of the second series is transmitted as soon as the data of a packet of the first series have been processed. While this ensures that the data are transmitted as rapidly as possible, the useful effect of the data compression will be very small, since in general only partially filled data packets will be formed.

In a third mode, account is indeed taken of stop codes or other indications that the end of a message or channel has been reached. If the last data packet of a message or channel is identified, the buffer concerned is flushed. Thus rapid data transmission is achieved at all times, while the formation of only partially filled data packets is considerably restricted.

It should be noted that in some systems for transmitting data packets it may be possible to distinguish between the end of a message and the end of a channel, for example by the transmission, at the end of a channel, of a special code or a special data packet. In that case it is advantageous to flush the buffers at the end of a message, but not to do so at the end of a channel.

Flushing the buffers, in this respect, involves transmitting the information remaining in the buffers. When the end of a channel occurs, however, the buffers may be "flushed", i.e. reset, without transmitting the remaining information. In both cases, the buffers will ultimately be empty. The "end of a channel" may occur when a logical channel is interrupted (e.g. "disconnect" in X.25) and when in the network a fault indication occurs (e.g. a "reset packet" in X.25), indicating that it is uncertain whether the data transmitted reached their destination.

Figure 5:
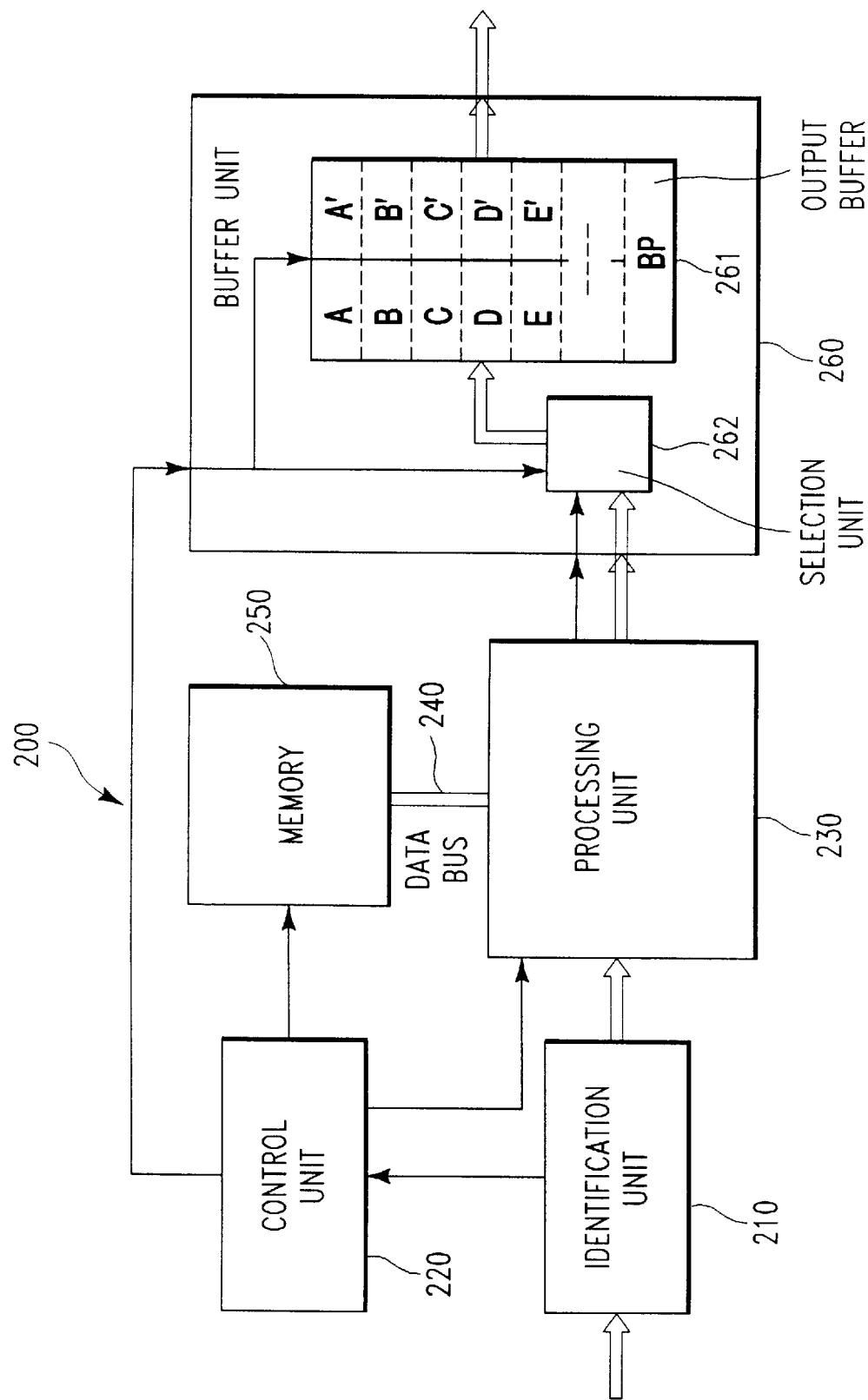
FIG. 5 schematically shows a second embodiment of a device for compressing and/or decompressing data packets according to the invention.

The device 200 depicted schematically in FIG. 5 comprises, like the device 100 of FIG. 4, an identification unit 210, a control unit 220, a processing unit 230 which is linked, via a data bus 240, to a memory 250, and a buffer unit 260. The identification unit 210 comprises an input buffer and, coupled thereto, identification means for identifying (the channel and/or subchannel of) incoming data packets.

In the device 200, the buffer unit 260 comprises an output buffer 261 which, according to the invention, is composed of a plurality of buffer sections A, B, C, etc., for the benefit of the corresponding channels. In contrast to the output buffer 161, the output buffer 261 of FIG. 5 comprises buffer sections which are implemented in duplicate, i.e. each buffer section comprises two further sections or compartments, each compartment being allocated to a particular subchannel. Thus for channel A, the compartments A and A' are provided. Similarly, the compartments B and B' are provided for channel B, etc. In the example given, the data of two subchannels can be buffered for each channel. It will be understood that the buffer sections may consist of a plurality of compartments, e.g. three, four or five, in order to support a plurality of subchannels for each channel. The supplementary buffer section BP ("bit pointer") need not be implemented in multiples, provided that it is of sufficient size to register the states of all buffer sections. The buffer section BP may also be constituted by reserved parts of the buffer sections A, A', B, B', etc.

Instead of providing, within a buffer 261, buffer sections having multiple compartments, the buffer 261 as a whole may be implemented in e.g. duplicate or triplicate, the buffer unit 260 thus comprising buffers 261, 261', etc. as necessary. Alternatively, the entire buffer unit 260 may be provided in multiple form.

As already stated above, the allocation of buffers or buffer sections to specific channels or subchannels need not be fixed and may if required be altered, depending on circumstances. Thus the buffer section A in FIG. 5, after subchannels A and A' have terminated, can be allocated, for example, to a (new) channel H.

The buffer unit 260 comprises a selection unit 262 which, in addition to the functions of the selection unit 161 of the buffer unit 160, performs a selection based on subchannels, i.e. the selection unit 262 assigns data to buffers sections based on both their channel and their subchannel identifications. Apart from the buffer unit 260, the device 200 may be functionally and constructively equivalent to the device 100 of FIG. 4. However, the processing unit 230 and the control unit 250 are preferably arranged for processing data in dependence on their respective subchannel identification. The identification unit 210 is likewise arranged for identifying subchannels.

The device 100 of FIG. 4 and the device 200 of FIG. 5 can be made from commercially available components (cf. reference 6). Advantageously, this device may also, however, be implemented as an application-specific integrated circuit (ASIC). In order to provide, in one device, both for compression and decompression for bidirectional traffic, two devices 100 can be accommodated together in one housing, or alternatively be completely integrated.

The system of FIG. 6 comprises compression and decompression devices 2 which are linked to one another via a network 1. In this arrangement, the devices 2 may each, for example, comprise two devices 100 or 200 of FIG. 4 or FIG. 5 respectively. The network 1 can be a communication network known per se, such as a network operating according to the X.25 protocol. A device 2 may have a plurality of units 3 connected thereto, which each may comprise multiplexers. If required, these units 3 may emit not data packets, but data streams, which are only formed into data packets in the devices 2. The devices 3 may have connected thereto a plurality of end users 4. Between the end users 4 a plurality of (logical) channels may be set up. By the invention being applied, the data of these channels can at all times be transmitted efficiently in compressed form via the network.

It will be understood by those skilled in the art that the invention is not limited to the embodiments shown and that many modifications and additions are possible without departing from the spirit and scope of the invention.

What is claimed is:

1. A method for converting a first series of data packets, each packet having a header field and a data field, into a second series of data packets, each packet having a header field and a data field, wherein both series of packets comprise packets from a plurality of channels, said method comprising the steps of:

compressing any data contained within said data fields of said first series without compressing said header fields;

buffering the compressed data per channel; and accommodating the compressed data into said data fields of said second series such that said data contained within said data field of said second series contains data of only one of said plurality of channels.

2. The method according to claim 1 further comprising the step of:

detecting whether or not a last data packet of a channel occurs in said first series; and accommodating all the buffered data of the channel in data packets of said second series if the last data packet of a channel is detected.

3. Method according to claim 2 further comprising the step of:

supplementing the data field of said last data packet of a channel with trailer data if said last data packet is not filled in its entirety.

4. Method according to claim 3, wherein said trailer data comprise a string of identical bits, at least eleven bits, with each bit in a ones state.

5. The method according to claim 1 further comprising the step of:

detecting whether a last data packet has occurred in said first series if by determining trailer data are present in a data packet of said second series.

6. Method according to claim 1, wherein a data field of said second series comprises compressed data and trailer data.

7. Method according to claim 2, wherein the occurrence of said last data packet of a channel is diagnosed on the basis of information in header fields of said data packets of said first series.

8. Method according to claim 1, wherein said data packets are designed for data transmission according to an X.25 protocol.

9. Method according to claim 2, wherein the occurrence of said last data packet of a channel is diagnosed on the basis of information in header fields of said data packets of said first series, wherein said data packets of said second series are designed for data transmission according to a X.25 protocol, and wherein the information on the basis of which the occurrence of said last data packet of a channel is diagnosed comprises a more bit.

10. The method according to claim 1 further comprising the step of:

applying, in the compression step, a table containing code words wherein said code words are based on the frequency of the occurrence of data.

11. Method according to claim 10, wherein said table is fixed during a predetermined period.

12. Method according to claim 1, wherein said compression step is performed only to data packets of some of the channels of said plurality of channels.

13. A method for converting a first series of data packets, each packet having a header field and a data field, into a second series of data packets each packet having a header field and a data field, and subsequently converting said second series of data packets into a third series of data packets, each packet having a header field and a data field, wherein each of said series of packets comprise data packets from a plurality of channels, said method comprising the steps of:

compressing any data contained within the data fields of said first series;

buffering the compressed data per channel;

accommodating the compressed data into said data fields of said second series such that said data contained in said data field of said second series contains data of only one of said plurality of channels;

decompressing the data contained within the data fields of the second series; and accommodating the decompressed data into said data fields of said third series.

14. Method according to claim 13, wherein data which are accommodated in a data field of said third series are buffered per channel.

15. Method according to claim 13, wherein data packets of said third series are identical to data packets of said first series.

16. A method for transmitting data packets, comprising the steps of:

transforming a first series of data packets, each having a header field and a data field, into a second series of data packets, each having a header field and a data field, both series comprising data packets of a plurality of channels, by:

compressing data from said data fields of said first series; and accommodating said compressed data in said data fields of said second series, such that each data field of said second series contains data of only one channel of said plurality of channels, and the data accommodated in a data field of said second series are buffered per channel;

transmitting said second series of data packets; and transforming said transmitted second series of data packets into a third series of data packets by:

decompressing the data of said second series; and accommodating the decompressed data in data fields of said third series.

17. Method according to claim 16 further comprising the step of:

transmitting data packet reconstruction information prior to said second series of data packets being transmitted.

18. Method according to claim 16, wherein, in said first series, data packets of at least one channel occur intermittently, and wherein, for that channel, at least one data packet of said second series is transmitted intermittently, even if the data field of that data packet is only partially filled.

19. Method according to claim 18, wherein the data packets of said second series are transmitted in accordance with an X.25 protocol.

20. Method according to claim 18, wherein a data packet of said second series is transmitted if a predetermined time has elapsed since the accommodation of data in an empty buffer of the one channel to which the data packet belongs.

21. A device for compressing data packets comprising:
    means for receiving a first series of data packets, each data packet having a header field and a data field;
    means for determining a respective channel of the data packets received;
    means for compressing the data field of each data packet to be compressed;
    means for forming a second series of data packets each having a header field and a data field;
    means for accommodating, in said data field of a data packet of said second series, a compressed data field of said first series;
    means for buffering per channel, data to be accommodated in a data field of said second series; and
    means for accommodating, in each data field of said second series, data of only one channel.

22. Device according to claim 21, wherein said buffering per channel means comprise at least two parallel buffers.

23. Device according to claim 22, having a separate buffer for each channel.

24. Device according to claim 21, wherein a memory space is reserved for each channel in a memory common to the channels.

25. Device according to claim 21, comprising means for generating trailer data.

26. System for transmitting data packets in compressed form, comprising:
    a device for compressing data packets, including
        means for receiving a first series of data packets each having a header field and a data field,
        means for determining the respective channels of the data packets received,
        means for compressing the data field of each data packet to be compressed,
        means for forming a second series of data packets each having a header field and a data field,
        means for accommodating, in said data field of a data packet of said second series, a compressed data field of said first series,
        means for buffering, per channel, data to be accommodated in a data field of said second series,
        means for accommodating, in each data field of said second series, data of only one channel,
        means for transmitting data packets, and
    at least one device for decompressing data packets, said device decompressing being provided with means for channel-dependent decompression of data packets.

27. System according to claim 26, wherein said means for transmitting data packets comprise an X.25 network.

28. A method for converting a first series of data packets, each data packet of the first series having a header field and a data field, into a second series of data packets, each data packet of the second series having a header field and a data field, wherein the data packets of both the first and second series are associated with a plurality of channels, said method comprising the steps of:
    compressing any data contained within the data fields of the data packets of the first series without compressing the header fields;
    buffering the compressed data in separate buffers, each of the separate buffers corresponding to a specific one of the plurality of channels such that, for each data packet, the compressed data is stored in a buffer corresponding to a channel to which the data packet is associated; and
    accommodating the compressed data into the data fields of the data packets of the second series such that the data contained in the data field of the data packets of the second series contains data of only one of said plurality of channels.

29. A method for converting a first series of packets including packets associated with a first channel and packets associated with a second channel, each packet of the first series having a header field and a data field, into a second series of packets, each packet of the second series having a header field and a data field, the method comprising steps of:
    compressing any data contained within the data fields of the packets of the first series, without compressing the header fields, to form compressed data corresponding to the first channel and compressed data corresponding to the second channel;
    buffering the compressed data corresponding to the first channel in a first buffer and buffering the compressed data corresponding to the second channel in a second buffer; and
    accommodating the compressed data into the data fields of the packets of the second series such that, in each packet of the second series, the data contained in the data field corresponds to only one of the first and second channels.

* * * * *